(12) United States Patent
Chen et al.

(10) Patent No.: US 8,791,013 B2
(45) Date of Patent: Jul. 29, 2014

(54) PATTERN FORMING METHOD

(75) Inventors: Shin-Chi Chen, Tainan (TW);
Yu-Tsung Lai, Tainan (TW);
Jiunn-Hsiung Liao, Tainan (TW);
Guang-Yaw Hwang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 158 days.

(21) Appl. No.: 13/568,137

(22) Filed: Aug. 7, 2012

(65) Prior Publication Data
US 2012/0302056 A1    Nov. 29, 2012

Related U.S. Application Data

(63) Continuation of application No. 12/952,179, filed on Nov. 22, 2010, now Pat. No. 8,298,935.

(51) Int. Cl.
*H01L 21/4763* (2006.01)
(52) U.S. Cl.
USPC ................................. 438/636; 257/E21.579
(58) Field of Classification Search
USPC ......... 438/636, 738, 637, 638, 692, 706, 710; 257/E21.579, E21.256, E21.257, 257/E21.575
See application file for complete search history.

(56) References Cited

U.S. PATENT DOCUMENTS

| 7,479,458 B1 | 1/2009 | Hwang |
| 2003/0047764 A1 | 3/2003 | Joo |
| 2007/0020565 A1 | 1/2007 | Koh |
| 2010/0099255 A1 | 4/2010 | Conley |

OTHER PUBLICATIONS

Cheon, Organic underlayer materials with exceptionally high thermal stability, 2009.
Chen, U.S. Appl. No. 13/033,696, filed Feb. 24, 2011.

*Primary Examiner* — Shaun Campbell
(74) *Attorney, Agent, or Firm* — Winston Hsu; Scott Margo

(57) ABSTRACT

A pattern forming method is disclosed. The method includes the steps of: forming a dielectric layer on a substrate; forming a first patterned mask on the dielectric layer, wherein the first patterned mask comprises an opening; forming a material layer on the dielectric layer and covering the first patterned mask; forming a second patterned mask on the material layer, wherein the second patterned mask comprises a first aperture; forming a second aperture in the second patterned mask after forming the first aperture, wherein the second aperture and the first aperture comprise a gap therebetween and overlap the opening; and utilizing the second patterned mask as an etching mask for partially removing the material layer and the dielectric layer through the first aperture and the second aperture.

19 Claims, 5 Drawing Sheets

PATTERN FORMING METHOD

CROSS REFERENCE TO RELATED APPLICATIONS

The present application is a continuation application of and claims priority to U.S. patent application Ser. No. 12/952,179, filed on Nov. 22, 2010, the entire contents of which are incorporated herein by this reference.

BACKGROUND OF THE INVENTION

1. Field of the Invention

The invention relates to a pattern forming method, and more particularly to a pattern forming method capable of applying ultra low-k material.

2. Description of the Prior Art

Dual damascene process is an interconnective process for connecting a metal wire and a via plug. A dual damascene structure is preferably used for connecting difference devices and wires in a semiconductor chip while using surrounding inter-metal dielectrics and inter-layer dielectrics for isolating other devices. As dual damascene process typically performs a chemical mechanical polishing (CMP) process at the last stage to planarize the surface of the chip for facilitating the deposition and the photo-lithography processes conducted afterwards and a preparation of multilevel interconnects, dual damascene structures are commonly used in fabricating semiconductor circuits.

In addition, the combination of the copper dual damascene technique and a low-k dielectric layer has become the best solution for fabricating metal interconnects in high integration and high-speed logic semiconductor chips as well as deep sub-micron meter semiconductor processes. As copper has a substantially lower resistance (such as 30% lower than aluminum) and a better electro-migration resistance, and low k dielectric materials have the characteristics of reducing the RC delay between metal wires, the utilization of low-k dielectric material and cooper dual damascene has become critically important in semiconductors fabrication.

However, as multiple resist coatings, bottom anti-reflective coating (BARC) coatings, exposures, developments, after developing inspections (ADI), etchings, and after etching inspections (AEI) are employed in conventional dual damascene processes, the cost and time required for a typical dual damascene process become even more consuming as the process progresses into sub-micron or even nanometer level. In particular, the rework performed for abnormalities found during the fabrication further degrades the quality of the inter-metal dielectric layer and results in issues such as dielectric constant k value degradation or critical dimension variations. This further causes line distortion or fragile dielectric layers by wiggling via hole or trenches, thereby affecting the yield of the metallization afterwards.

As the development of semiconductor circuitry becomes more precise and complex, how to effectively improve the yield of dual damascene process has become an important task in this industry.

SUMMARY OF THE INVENTION

It is an objective of the present invention to provide a pattern forming method capable of applying ultra low-k material.

According to a preferred embodiment of the present invention, a pattern forming method is disclosed. The process includes the steps of: forming a dielectric layer on a substrate; forming a first patterned mask on the dielectric layer, wherein the first patterned mask comprises an opening; forming a material layer on the dielectric layer and covering the first patterned mask; forming a second patterned mask on the material layer, wherein the second patterned mask comprises a first aperture; forming a second aperture in the second patterned mask after forming the first aperture, wherein the second aperture and the first aperture comprise a gap therebetween and overlap the opening; and utilizing the second patterned mask as an etching mask for partially removing the material layer and the dielectric layer through the first aperture and the second aperture.

As the present invention preferably forms an etch stop layer, a material layer, and a passivation layer on top of the dielectric layer used for forming the predetermined dual damascene pattern, the dielectric layer is protected from etching, cleaning, and resist stripping conducted for forming trenches and via holes through patterned mask as well as rework carried out for abnormalities found in ADI or AEI processes. As a result, the quality and yield of the inter-metal dielectric and the dual damascene pattern are improved substantially.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
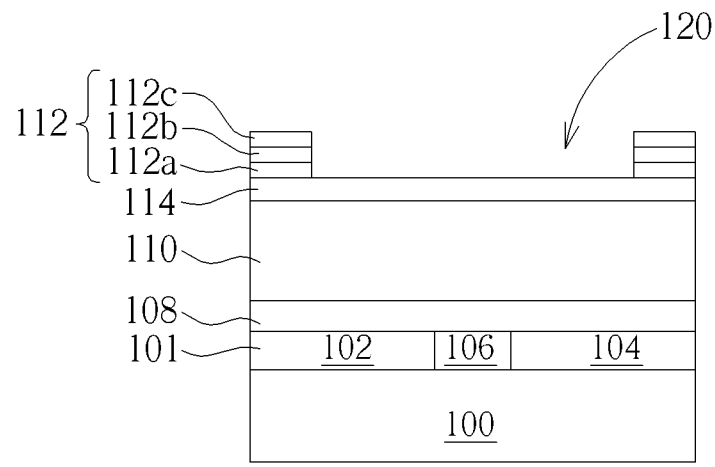
FIGS. 1-10 illustrate perspective views of a pattern forming method according to a preferred embodiment of the present invention.

Referring to FIGS. 1-10, FIGS. 1-10 illustrate perspective views of a pattern forming method according to a preferred embodiment of the present invention. As shown in FIG. 1, a substrate 100, such as a silicon substrate, a silicon-containing substrate, or silicon-on-insulator substrate is provided. At least two conductive elements 102, 104 are formed on the surface of the substrate 100, and an insulating material layer 106 is formed between the conductive elements 102, 104 to isolate the two elements 102, 104. The conductive elements 102, 104 could be at least one of the following: sources/drains and gates of metal-oxide semiconductor devices, resistors, through-silicon via (TSV), doped regions, or metal conductive wiring layers, and the insulating material layer 106 could be an interlayer dielectric layer or a shallow trench isolation (STI). Depending on the requirements for the product, at least one interlayer dielectric layer 101 could be formed between the conductive elements 102, 104 and the substrate 100.

A cap layer 108, a dielectric layer 110, and a first patterned mask 112 are then sequentially formed on the surface of the substrate 100. The cap layer 108 is preferably a material layer formed selectively for protecting the conductive elements 102, 104 and enforcing the adhesion of the dielectric layer 110 afterwards. The cap layer 108 is selected from a material consisting of SiN, SiO, SiC, SiCN, and SiON. Preferably, the cap layer 108 is a dielectric layer containing nitrogen, but not limited thereto.

The dielectric layer 110 could be composed of a single layer or multiple layers dielectric material, and is preferably selected from an inorganic or organic dielectric material having a dielectric constant lower than 3.5. For example, the dielectric layer could be a FSG (fluorine-doped oxide) layer, an HSQ (hydrogen silsesquioxane) (SiO: H) layer, an MSQ (methyl silsesquioxane) (SiO: CH) layer, a HOSP (hybrid organic siloxane polymer) layer, an H-PSSQ (hydrio polysilsesquioxane) layer, an M-PSSQ (methyl polysilsesquioxane) layer, a P-PSSQ (phenyl polysilsesquioxane) layer or a porous gel (porous sol-gel) layer, but should not be limited thereto. Preferably, the dielectric layer 110 is an ultra low-k (ULK) dielectric layer having a dielectric constant lower than 2.5. The formation of the dielectric layer 110 could be achieved by chemical vapor deposition (CVD), plasma enhanced chemical vapor deposition (PECVD), high density plasma CVD, or spin-on coating, but not limited thereto.

The first patterned mask 112 has an opening 120 for defining the location of the trench opening of the dual damascene structure, in which the relative position of the opening 120 is substantially between the two conductive elements 102, 104 while partially overlapping the two elements 102, 104. The first patterned mask 112 could be a single layer mask or a multilayer mask, and could also be a metal mask, a non-metal mask, or combination thereof. In this embodiment, the patterned mask 112 is a multilayer mask, such as a multilayer structure having a titanium layer 112a, a titanium nitride layer 112b, and an oxide layer 112c. The formation of the mask 112 preferably includes the steps of forming the titanium layer 112a, the titanium nitride layer 112b, and the oxide layer 112c sequentially to form a mask layer, conducting a resist coating and a lithography to form a patterned resist (not shown), and performing an etching process through a pattern transfer to form an opening 120 in the mask layer thereby forming the first patterned mask 112. Depending on the requirements of the product, an etch stop layer 114 composed of SiON could be formed selectively between the first patterned mask 112 and the dielectric layer 110. The etch stop layer 114 is preferably used as an etching barrier layer to protect the dielectric layer 110 underneath during the pattern transfer of the first patterned mask 112. Moreover, if a problem is found during the ADI or AEI for the first patterned mask 112, a rework is preferably carried out directly. As the etch stop layer 114 is disposed on the dielectric layer 110, the dielectric layer 110 is protected from etching, cleaning, and resist stripping conducted for the first patterned mask 112 and rework carried out for abnormal ADI or AEI, thereby ensuring the quality of the dielectric layer.

Figure 2:
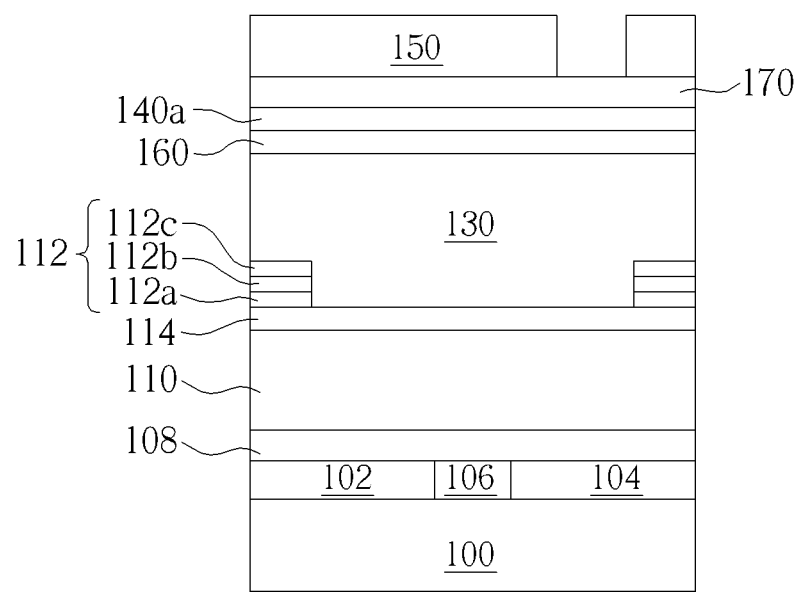
Figure 3:
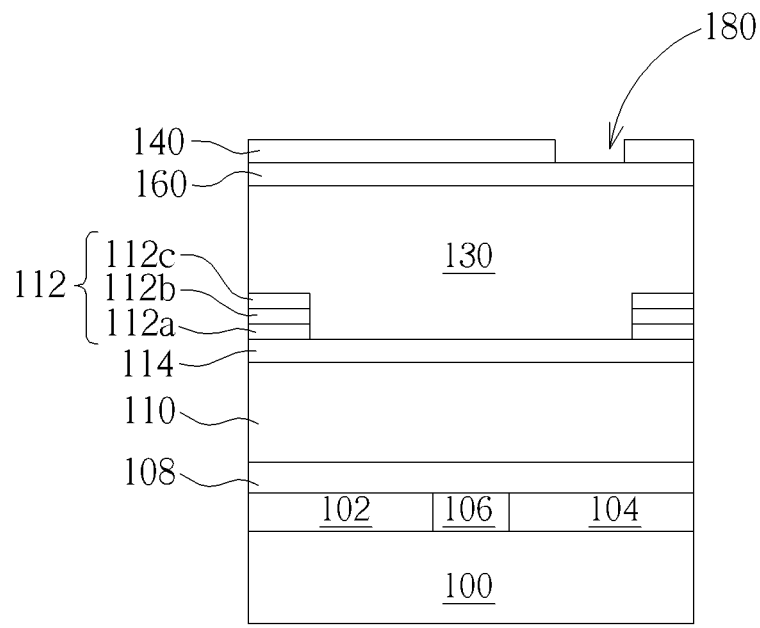

As shown in FIGS. 2 and 3, a material layer 130 and a second patterned mask 140 are then sequentially formed on the surface of the substrate 100 and the first patterned mask 112, the etching stop layer 114, and the dielectric layer 110. The material layer 130 could include high polymer material including C, H, O, such as a carbon-spin on hardmask (C-SOH), but not limited thereto. A first aperture 180 is formed in the second patterned mask 140 to define the location of the via hole of dual damascene structure, and the first aperture 180 is formed substantially on top of either one of the conductive elements 102, 104, such as on top of the element 104.

According to a preferred embodiment of the present invention, the second patterned mask 140 could be a multilayer mask or a single layer mask, such as a single oxide layer. The formation of such layer could be accomplished by first using CVD to form a mask layer 140a composed of silicon oxide composition, forming a patterned resist 150 on the mask layer 140a, and performing an etching process or pattern transfer to form the first aperture 180 in the mask layer 140a thereby forming the second patterned mask 140. Depending on the requirements of the product, a passivation layer 160, such as a SiN layer could be formed selectively between the second patterned mask 140 and the material layer 130. The passivation layer 160 is preferably used as an etch stop layer for protecting the material layer 130 underneath as a pattern transfer is performed on the second patterned mask 140. A first BARC 170, such as a SiON layer could be formed selectively between the patterned resist 150 and the second patterned mask 140.

Figure 4:
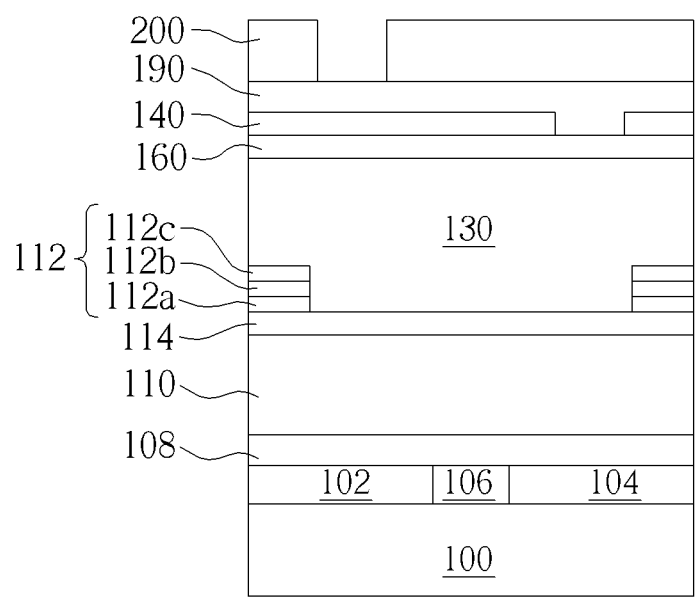
Figure 5:
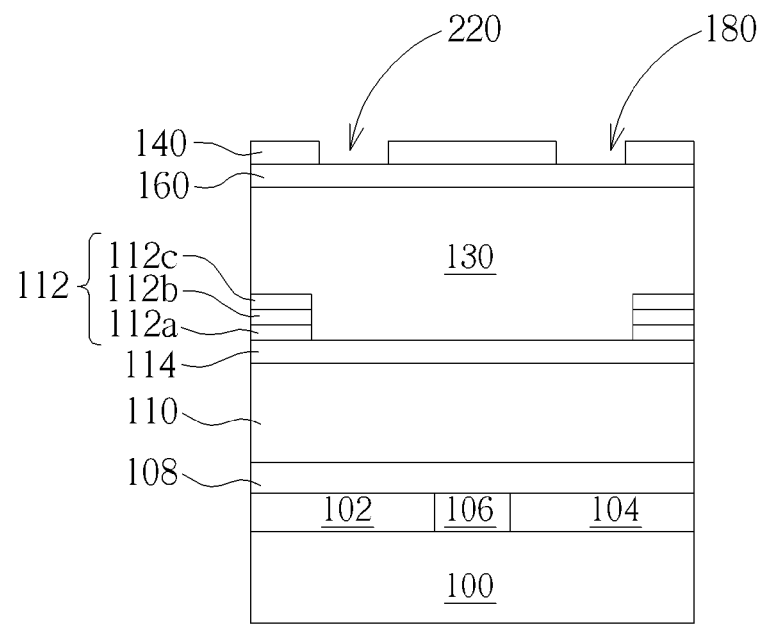

As shown in FIGS. 4 and 5, a deposition, a resist coating and a developing process are then carried out to sequentially form a second BARC 190 and a patterned resist 200 on the surface of the substrate 100 and the second patterned mask 140, the passivation layer 160, and the material layer 130. Another etching process or a pattern transfer is performed by using the patterned resist 200 as a mask and using the passivation layer 160 as an etch stop layer to form a second aperture 220 in the second patterned mask 140. The second aperture 220 is preferably formed to define the location of another via hole of the dual damascene structure, in which the second aperture 120 is formed substantially on top of either one of the conductive elements 102, 104, such as on top of the element 102.

It should be noted that the second aperture 220 and the first aperture 180 do not overlap each other and a gap is formed therebetween, wherein said gap is preferably smaller than the minimum gap resolution for developing the first patterned resist 150. This embodiment preferably adjusts the thickness of the resist 150, the resist 200, the first BARC 170 and the second BARC 190 so that these layers are consumed entirely during the etching of the first aperture 180 and the second aperture 220. Moreover, a cleaning process could be employed to totally remove the remaining resist 150 and the first BARC 170, the resist 200 and the second BARC 190. If problems were found during ADI or AEI conducted in FIGS. 2 and 5, a rework could be performed at anytime to resolve the issue, and as an etch stop layer 114, a material layer 130, and a passivation layer 160 are disposed on top of the dielectric layer 110, the dielectric layer 110 if unaffected by the etching, the cleaning, and the resist stripping steps as revealed in FIGS. 2 and 5, and is also protected from any k value degradation or critical dimension variation caused by the rework carried out for ADI or AEI, thereby ensuring the quality of the inter-metal dielectric layer and of the dual damascene pattern.

Figure 6:
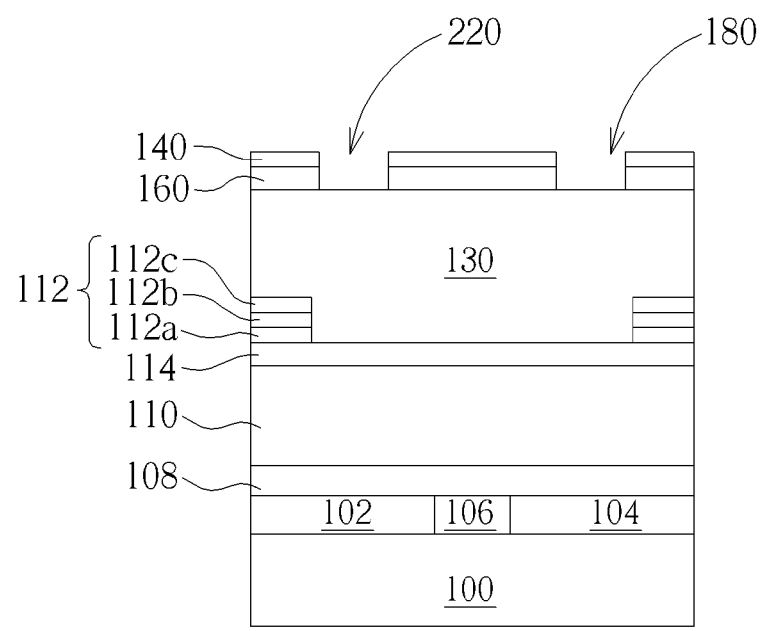

After confirming the layout pattern of the first aperture 180 and the second aperture 220 through ADI, as shown in FIG. 6, the second patterned mask 140 is used as etching mask to etch the passivation layer 160 for transferring the pattern of the first aperture 180 and the second aperture 220 in the second patterned mask 140 to the passivation layer 160.

Figure 7:
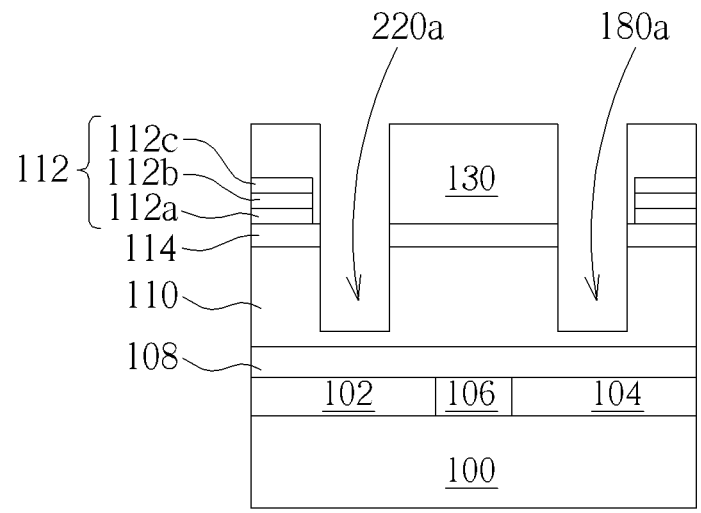
Figure 8:
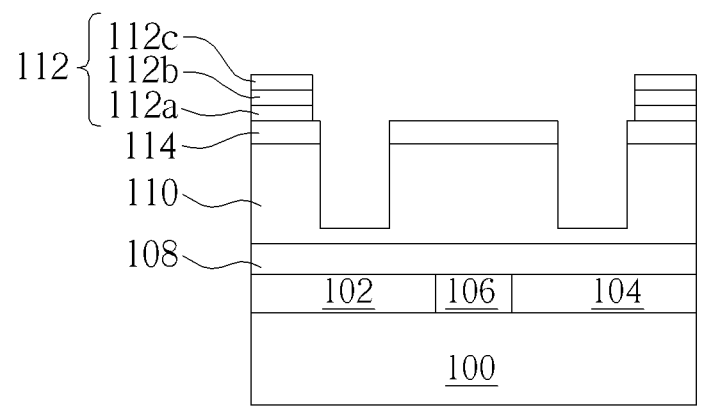

As shown in FIG. 7, the second patterned mask 140 and the passivation layer 160 are then used as an etching mask to partially etch the material layer 130, the etch stop layer 114, and the dielectric layer 110 by transferring the pattern of the first aperture 180 and the second aperture 220 to the material layer 130, the etch stop layer 114, and the dielectric layer 110 to form a first via hole 180a and a second via hole 220 in the dielectric layer. Similarly, the thickness and the etching parameters of the second patterned mask 140 and the passivation layer 160 could also be adjusted so that the mask 140 and the layer 160 could be consumed entirely during the etching of the first via hole 180a and the second via hole 220a. Moreover, a cleaning process could be employed to completely remove the remaining second patterned mask 140 and the passivation layer 160. As shown in FIG. 8, a stripping process is then performed by injecting gases containing $CO_2$, CO, or hydrogen to totally remove the remaining material layer 130 to expose the first patterned mask 112 having the opening 120 pattern and the etch stop layer 114 having the first via hole 180a and the second via hole 220a pattern.

Figure 9:
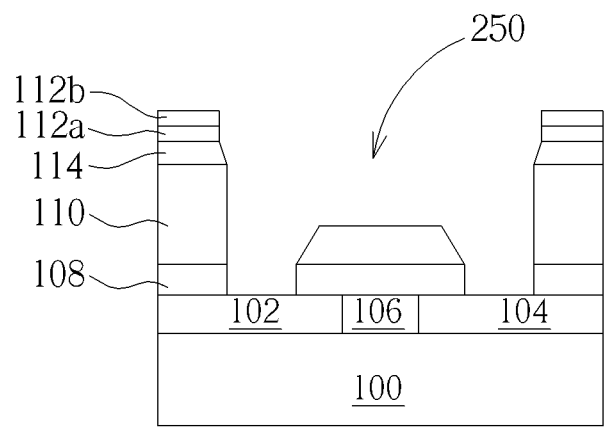

As shown in FIG. 9, the dielectric layer 110 and the cap layer 108 are etched by using the first patterned mask 112 and the etch stop layer 114 as an etching mask to transfer the pattern of the opening 120 to the dielectric layer 110 and the pattern of the first via hole 180a and the second via hole 220a to the dielectric layer 110 and the cap layer 108 to expose the conductive elements 104 and 102. This completes the pattern forming process, i.e. the fabrication of a dual damascene pattern 250.

It should be noted that the first patterned mask 112 is a multilayer mask, which preferably includes metal materials such as a titanium layer 112a and a TiN layer 112b that have substantially higher etching selectivity with respect to the dielectric layer 110, the cap layer 108, and the etch stop layer 114. As the pattern forming process for fabricating the dual damascene pattern 250 is completed, the oxide layer 112c of the first patterned mask 112 is consumed entirely, and only the titanium layer 112a and the TiN layer 112b remain on the substrate 100.

Figure 10:
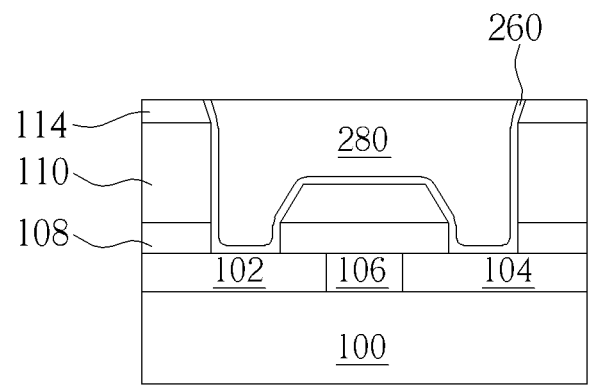

A conductive material is then filled in the dual damascene pattern 250 to electrically connect the conductive elements 102 and 104 to form a dual damascene structure. For instance, a barrier layer 260 and a seed layer (not shown) are sequentially deposited through CVD, PVD, or electroplating processes and a copper layer 280 is formed through electroplating. The barrier layer could be a composite diffusing barrier layer consisting of Ta, TaN, Ti, TiN, or combination thereof. The barrier layer could be a double or triple layer structure for preventing copper ions of copper layer 280 from migrating to the dielectric layer 110. A planarizing process is conducted thereafter to remove conductive materials other than the dual damascene pattern 250 while removing the remaining titanium layer 112a and titanium nitride layer 112b until reaching the top of the etch stop layer 114 or the dielectric layer 110, as shown in FIG. 10. As these processes are well known to those skilled in the art, the details of which are omitted herein for the sake of brevity.

The aforementioned embodiment is preferably employed through a partial-via-first process. However, trench-first processes, via-first processes, and self-aligned processes could also be incorporated into the aforementioned dual damascene process, which are all within the scope of the present invention.

In Summary, the preferred embodiment of the present invention allows a rework process to be done at any time, and since the etch stop layer, the material layer, and the passivation layer are formed on the top of the dielectric layer used to form the predetermined dual damascene pattern, the dielectric layer is preferably protected from etching, cleaning, and resist stripping processes addressed in FIGS. 1 and 5 and rework done for abnormal ADI or AEI processes, thereby preventing issues, such as dielectric constant k value degradation or critical dimension variation, thereby ensuring the layout pattern quality of the opening, the first aperture, and the second aperture formed in the first patterned mask, the second patterned mask and the passivation layer. After the pattern is transferred to the dielectric layer through a follow-up etching process, issues such as k-value degradation or CD variation are prevented and the quality and the yield of the inter-metal dielectric and of the dual damascene pattern are also improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pattern forming method, comprising:
    forming a dielectric layer on a substrate;
    forming a first patterned mask on the dielectric layer, wherein the first patterned mask comprises an opening;
    forming a material layer on the dielectric layer and covering the first patterned mask;
    forming a second patterned mask on the material layer, wherein the second patterned mask comprises a first aperture;
    forming a second aperture in the second patterned mask after forming the first aperture, wherein the second aperture and the first aperture comprise a gap therebetween and overlap the opening; and
    utilizing the second patterned mask as an etching mask for partially removing the material layer and the dielectric layer through the first aperture and the second aperture.

2. The pattern forming method of claim 1, wherein the k-value of the dielectric layer is lower than 2.5.

3. The pattern forming method of claim 1, further comprising a conductive element in the substrate, an insulating material electrically isolating the conductive element, and a cap layer between the dielectric layer and the substrate, wherein the cap layer covers the conductive element.

4. The pattern forming method of claim 1, further comprising an interlayer dielectric layer between the dielectric layer and the substrate, at least one conductive element in the interlayer dielectric layer, and a cap layer between the dielectric layer and the interlayer dielectric layer and covering the conductive element.

5. The pattern forming method of claim 1, wherein the first patterned mask comprises a metal mask.

6. The pattern forming method of claim 1, wherein the first patterned mask comprises a multilayer hard mask.

7. The pattern forming method of claim 6, wherein the first patterned mask comprises a titanium layer, a titanium nitride layer, and an oxide layer.

8. The pattern forming method of claim 1, wherein the step of forming the second patterned mask comprises:
    forming a mask layer on the dielectric layer;
    forming a first patterned resist on the mask layer;
    using the first patterned resist as an etching mask to etch the first aperture in the mask layer for forming the second patterned mask; and
    stripping the first patterned resist.

9. The pattern forming method of claim 8, wherein the step of forming the second aperture in the second patterned mask comprises:
    forming a second patterned resist on the second patterned mask;
    using the second patterned resist as an etching mask to etch the second aperture in the second patterned mask; and
    stripping the second patterned resist.

10. The pattern forming method of claim 9, further comprising a passivation layer between the second patterned mask and the dielectric layer for protecting the material layer while forming the first aperture and the second aperture.

11. The pattern forming method of claim 10, further comprising using the second patterned mask as an etching mask to perform an etching process for forming the first aperture and the second aperture in the passivation layer.

12. The pattern forming method of claim 8, further comprising a first bottom anti-reflective coating (BARC) between the first patterned resist and the second patterned mask.

13. The pattern forming method of claim 9, further comprising a second bottom anti-reflective coating between the second patterned resist and the second patterned mask.

14. The pattern forming method of claim 8, wherein the gap is smaller than the minimum gap resolution for forming the first patterned resist.

15. The pattern forming method of claim 1, further comprising completely removing the material layer after partially removing the material layer and the dielectric layer through the first aperture and the second aperture.

16. The pattern forming method of claim 15, further comprising using the first patterned mask as an etching mask for forming a dual damascene pattern in the dielectric layer after completely removing the material layer.

17. The pattern forming method of claim 16, further comprising forming a metal layer in the dual damascene pattern after forming the dual damascene pattern.

18. The pattern forming method of claim 17, wherein the metal layer comprises copper.

19. The pattern forming method of claim 1, wherein the opening comprises a trench opening, and at least one of the first aperture and the second aperture comprises a via hole.

* * * * *